United States Patent
Song

(10) Patent No.: US 10,164,635 B2
(45) Date of Patent: Dec. 25, 2018

(54) LOW VOLTAGE TRANSMITTER WITH VARIABLE OUTPUT SWING

(75) Inventor: Hongjiang Song, Mesa, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 150 days.

(21) Appl. No.: 13/993,675

(22) PCT Filed: Dec. 16, 2011

(86) PCT No.: PCT/US2011/065474
§ 371 (c)(1),
(2), (4) Date: Jun. 12, 2013

(87) PCT Pub. No.: WO2013/089773
PCT Pub. Date: Jun. 20, 2013

(65) Prior Publication Data
US 2014/0055163 A1   Feb. 27, 2014

(51) Int. Cl.
*H03K 19/0175*   (2006.01)
*H04L 25/02*   (2006.01)
*G06F 1/32*   (2006.01)

(52) U.S. Cl.
CPC ....... *H03K 19/017509* (2013.01); *G06F 1/32* (2013.01); *H04L 25/0276* (2013.01)

(58) Field of Classification Search
None
See application file for complete search history.

(56) References Cited

U.S. PATENT DOCUMENTS

| | | | | |
|---|---|---|---|---|
| 4,871,928 A | * | 10/1989 | Bushey | H03K 5/151 326/110 |
| 5,442,304 A | * | 8/1995 | Wong | H03K 19/01721 326/17 |
| 5,546,016 A | * | 8/1996 | Allen | H03K 19/018521 326/30 |
| 5,760,620 A | * | 6/1998 | Doluca | H03K 17/164 326/83 |
| 5,986,479 A | * | 11/1999 | Mohan | H03K 17/6872 326/115 |
| 6,130,563 A | * | 10/2000 | Pilling | H03K 17/164 327/111 |
| 6,320,422 B1 | * | 11/2001 | Koh | H03K 5/2481 326/112 |

(Continued)

OTHER PUBLICATIONS

Int'l Search Report and Written Opinion dated Aug. 30, 2012 for Int'l Patent Application No. PCT/US2011/065474.

(Continued)

*Primary Examiner* — Crystal L Hammond
(74) *Attorney, Agent, or Firm* — Womble Bond Dickinson (US) LLP

(57) ABSTRACT

Described herein are apparatus, system, and method for improving output signal voltage swing of a voltage mode transmitter (Tx) driver. The Tx driver may use a single power supply which is the same as the power supply of the core processor. The apparatus comprises: a voltage mode driver coupled to an output node; a switching current source, coupled to the output node, to increase voltage swing of a signal on the output node, wherein the signal is driven by the voltage mode driver; and a bias generator to bias the switching current source.

25 Claims, 7 Drawing Sheets

(56) References Cited

U.S. PATENT DOCUMENTS

| | | | | |
|---|---|---|---|---|
| 6,812,733 B1* | 11/2004 | Plasterer | H03K 3/356104 326/115 |
| 6,856,178 B1* | 2/2005 | Narayan | H03K 19/018585 326/87 |
| 7,215,156 B1* | 5/2007 | Li | H04L 25/0282 326/115 |
| 8,446,173 B1* | 5/2013 | Faucher | H03K 19/00361 326/27 |
| 2002/0109525 A1* | 8/2002 | Shin | H03K 19/00384 326/26 |
| 2004/0150430 A1 | 8/2004 | Li et al. | |
| 2004/0232945 A1* | 11/2004 | Tseng | H03K 19/018578 326/68 |
| 2004/0246026 A1* | 12/2004 | Wang | H03K 19/018585 326/86 |
| 2006/0181303 A1* | 8/2006 | Dreps | G06F 13/4072 326/29 |
| 2006/0181304 A1* | 8/2006 | Dreps | H03K 19/0005 326/30 |
| 2006/0220674 A1* | 10/2006 | Yeung | H03K 19/018528 326/29 |
| 2008/0061837 A1* | 3/2008 | Xu | H03K 19/018528 326/127 |
| 2008/0238482 A1* | 10/2008 | Tian | H03K 19/00384 326/82 |
| 2009/0184696 A1* | 7/2009 | Patent | G05F 3/262 323/265 |
| 2010/0001701 A1* | 1/2010 | Cygan | H03F 3/2173 323/282 |
| 2010/0026251 A1* | 2/2010 | Lam | H02M 3/156 323/273 |
| 2010/0201340 A1* | 8/2010 | Raghavan | H03K 19/018521 323/311 |
| 2010/0271069 A1* | 10/2010 | Kim | G11C 7/1051 326/80 |
| 2011/0128036 A1* | 6/2011 | Liu | H03K 19/018521 326/30 |
| 2011/0133780 A1* | 6/2011 | Shau | 326/87 |
| 2012/0025800 A1* | 2/2012 | Dettloff | H04L 25/0272 323/299 |
| 2012/0146686 A1* | 6/2012 | Maarouf | H03K 19/00384 326/30 |

OTHER PUBLICATIONS

PCT/US2011/065474 Notification Concerning Transmittal of International Preliminary Report on Patentability, dated Jun. 26, 2014, 5 pages.

* cited by examiner

LOW VOLTAGE TRANSMITTER WITH VARIABLE OUTPUT SWING

CLAIM OF PRIORITY

This application claims the benefit of priority of International Patent Application No. PCT/US2011/065474 filed Dec. 16, 2011, titled "LOW VOLTAGE TRANSMITTER WITH VARIABLE OUTPUT SWING," which is incorporated by reference in its entirety.

FIELD OF THE INVENTION

Embodiments of the invention relate generally to the field of input-output (I/O) transmitters in a processor. More particularly, embodiments of the invention relate to a low voltage I/O transmitter with variable wide output signal swing.

BACKGROUND

As processor operating power supply levels are lowered to reduce power consumption of the processor, performance of input-output (I/O) transmitters of the processor is adversely affected. The term "performance" herein refers to signal integrity attributes of a signal such as output signal swing of the signal driven by a transmitter, slew rate of the signal driven by a transmitter, eye width and height of the output signal swing, etc.

For example, for advanced CMOS process technologies of 22 nm or 14 nm, the operating voltage of the processor is scaled down below 0.9V. At such low power supply levels, the I/O transmitters generally cannot meet their specifications of performance parameters discussed above. One possible means for meeting the performance parameters is to provide dedicated higher power supplies to the I/O transmitters than the power supply provided to the rest of the core processor. However, such solutions are expensive and require dedicated power supplies and voltage regulators.

I/O transmitter (Tx) drivers are generally of two categories—current mode Tx driver and voltage mode Tx drivers. Current mode Tx driver, such as a current mode logic (CML), suffers from headroom degradation at lower power supply levels. The term "headroom" herein refers to the amount of power supply level needed to keep the current source of the current mode Tx to remain in the transistor saturation region. As power supply level reduces, the current source of the current mode Tx suffers from reduced capability to remain in saturation mode. Lower power supply levels for current mode Tx driver also cause degraded output impedance of the current source of the current mode Tx driver. While the output impedance may be improved by increasing the size (W/L) of the current source of the current mode Tx driver, a larger current source results in higher parasitic capacitances and thus reduced output voltage swing.

The term "voltage swing" herein refers to the peak-to-peak voltage difference of the signal driven by a driver of a Tx measured from the logical low level to the logical high level of the output signal.

FIG. 1 is a voltage mode I/O Tx driver 100 that exhibits low power supply rejection ratio (PSSR) with limited output signal swing. The driver 100 consists of a pull-up device Mp1, a pull-down device Mn1, and an output impedance R. The output signal swing at the output node Vo is directly proportional to the supply voltage. As power supply voltage level is reduced, the output signal swing reduces. A reduced output signal swing results in narrower eye width and height and degradation of other performance parameters.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
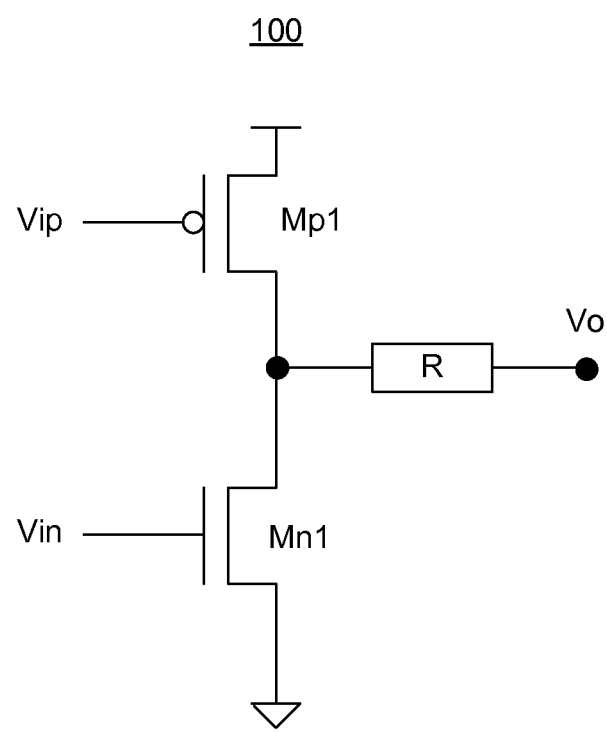
FIG. 1 is a voltage mode input-output (I/O) transmitter driver that exhibits low power supply rejection ratio (PSSR) with limited output signal swing.

Embodiments of the invention relate to an apparatus, system, and method for improving output signal voltage swing of a voltage mode transmitter (Tx) driver. In one embodiment, the Tx driver uses a single power supply which is the same as the power supply of the core processor. The term "improving" with context to the output signal voltage swing herein refers generally to increasing the output signal voltage swing compared to voltage swings generated by traditional Tx drivers such as the one shown in FIG. 1.

In one embodiment, apparatus for improving the output signal swing of the voltage mode Tx driver comprises a hybrid voltage mode Tx driver which includes: the voltage mode Tx driver coupled to an output node; a switching current source, coupled to the output node, to increase voltage swing of a signal on the output node, wherein the signal is driven by the voltage mode driver; and a bias generator to bias the switching current source. In one embodiment, the switching current source comprises: a first switching current source, coupled to the output node, to increase voltage swing of the signal on the output node, the first current source to increase the voltage swing of the signal by raising a logical high level of the signal; and a second current source, coupled to the output node, to increase the voltage swing of the signal by lowering a logical low level of the signal.

The technical effects of the hybrid voltage mode Tx driver with the switching current source are many. One such technical effect is to increase the output signal swing of the Tx driver while lowering the power supply level for the processor including the power supply level to the voltage mode Tx driver. In one embodiment, the Tx driver operates at the same power supply level as the core processor. In such an embodiment, the use of multiple power supply levels can be limited for the entire processor design. The embodiments discussed herein reuses a traditional voltage mode Tx driver design and provides the benefit of increased output signal swing at lower power supply voltage levels (e.g., 0.9V and lower) without using multiple power supplies for the Tx driver. The hybrid voltage mode Tx driver is also operable to adjust, i.e., program, the output signal swing to match the specification requirements of any voltage mode I/O driver output signal swing specification. Thus, a single voltage mode Tx driver design can be scaled down to operate for various power supply levels and process technologies. The embodiments discussed herein also result in improved output impedance definition (i.e., defined in ratios of resistances) for operating the Tx driver at lower power supply levels and with improved output signal swing. The above technical effects are not a limited set of effects. Other technical effects, such as improved PSSR, etc., are also demonstrated by the embodiments discussed herein.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Figure 2:
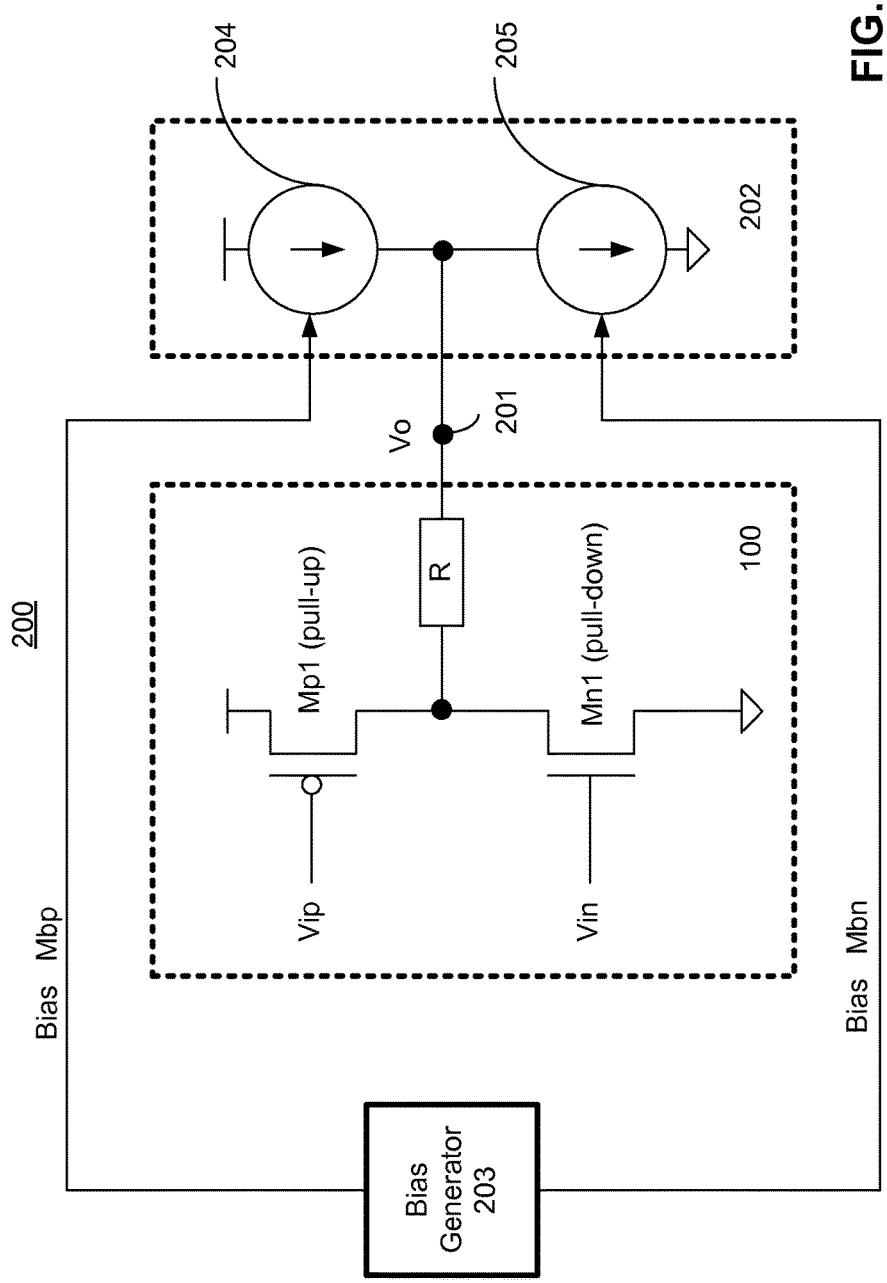
FIG. 2 is a high level circuit of a hybrid voltage mode I/O driver with variable wide output signal swing and improved PSSR, according to one embodiment of the invention.

FIG. 2 is a high level circuit of a hybrid voltage mode I/O driver 200 with variable wide output signal swing and improved PSSR, according to one embodiment of the invention. The embodiment of FIG. 2 is discussed with reference to FIG. 1. For purposes of this application, the transistors described in this application may be metal oxide semiconductor (MOS) transistors, which include drain, source, and gate terminals. However, those skilled in the art will appreciate that other transistors may be used without departing from the scope of the invention.

In one embodiment, the hybrid voltage mode Tx driver 200 comprises the voltage mode Tx driver 100 coupled to an output node 201. As shown in FIG. 1, the output node 201 is coupled to the pull-up device Mp1 and pull-down device Mn1 via termination impedance R. In one embodiment, the termination impedance R is designed to match the impedance of the transmission line (not shown) coupled to the hybrid voltage mode Tx driver 200. In one embodiment, the termination impedance R is compensated for process, voltage, and temperature (PVT) variations, and is adjustable/programmable to adjust the output signal swing of the signal on the output node 201. In one embodiment, the termination impedance R is adjustable/programmable by software (e.g., operating system) or hardware (control logic, fuses, etc.) or combination of both. In the embodiments discussed herein, parasitic capacitances of the transistors Mp1 and Mn1 are shielded from the output node 201 via the termination impedance R.

In one embodiment, the hybrid voltage mode Tx driver 200 comprises a switching current source 202, coupled to the output node 201, to increase voltage swing of a signal on the output node 201, wherein the signal is driven by the voltage mode driver 100. In one embodiment, the switching current source 202 operates on the same power supply level as the voltage mode driver 100. In such an embodiment, multiple power supplies are no longer needed to provide wider output signal swing to the signal driven by the voltage mode driver 100. For example, the power supply levels of the hybrid voltage mode Tx driver 200 can be the same as the power supply level of the core processor. In such an embodiment, as the power supply level of the processor core is reduced to reduce power consumption, the I/O driver operates at lower power supply but continues to provide a wider output signal swing which is not possible for the voltage mode Tx driver 100 of FIG. 1.

In one embodiment, the switching current source 202 comprises a first switching current source 204, coupled to the output node 201, to increase voltage swing of the signal on the output node 201, the first current source to increase the voltage swing of the signal by raising a logical high level of the signal. In one embodiment, the first switching current source 204 is operable to inject current, to raise the logical high level of the signal, from a power supply node to the output node when the pull-up device of the voltage mode Tx driver 100 is on. In one embodiment, the switching current source 202 comprises a second current source 205, coupled to the output node 201, to increase the voltage swing of the signal by lowering a logical low level of the signal. The second switching current source 205 is operable to sink current, to lower the logical low level of the signal, from the output node to a ground node when the pull-down device of the voltage mode Tx driver 100 is on.

In one embodiment, the hybrid voltage mode Tx driver 200 comprises a bias generator 203 to bias the switching current source 202. In one embodiment, the bias generator 203 is a replica bias generator with a circuit topology same as the circuit topology of the first and second current sources 204 and 205. In one embodiment, the bias generator 203 is a bandgap circuit. In other embodiments, other types of bias generation circuits may be used without changing the essence of the embodiments of the invention. In one embodiment, a single bias generator 203 may be used to supply bias voltage to two or more hybrid voltage mode Tx drivers.

Figure 3:
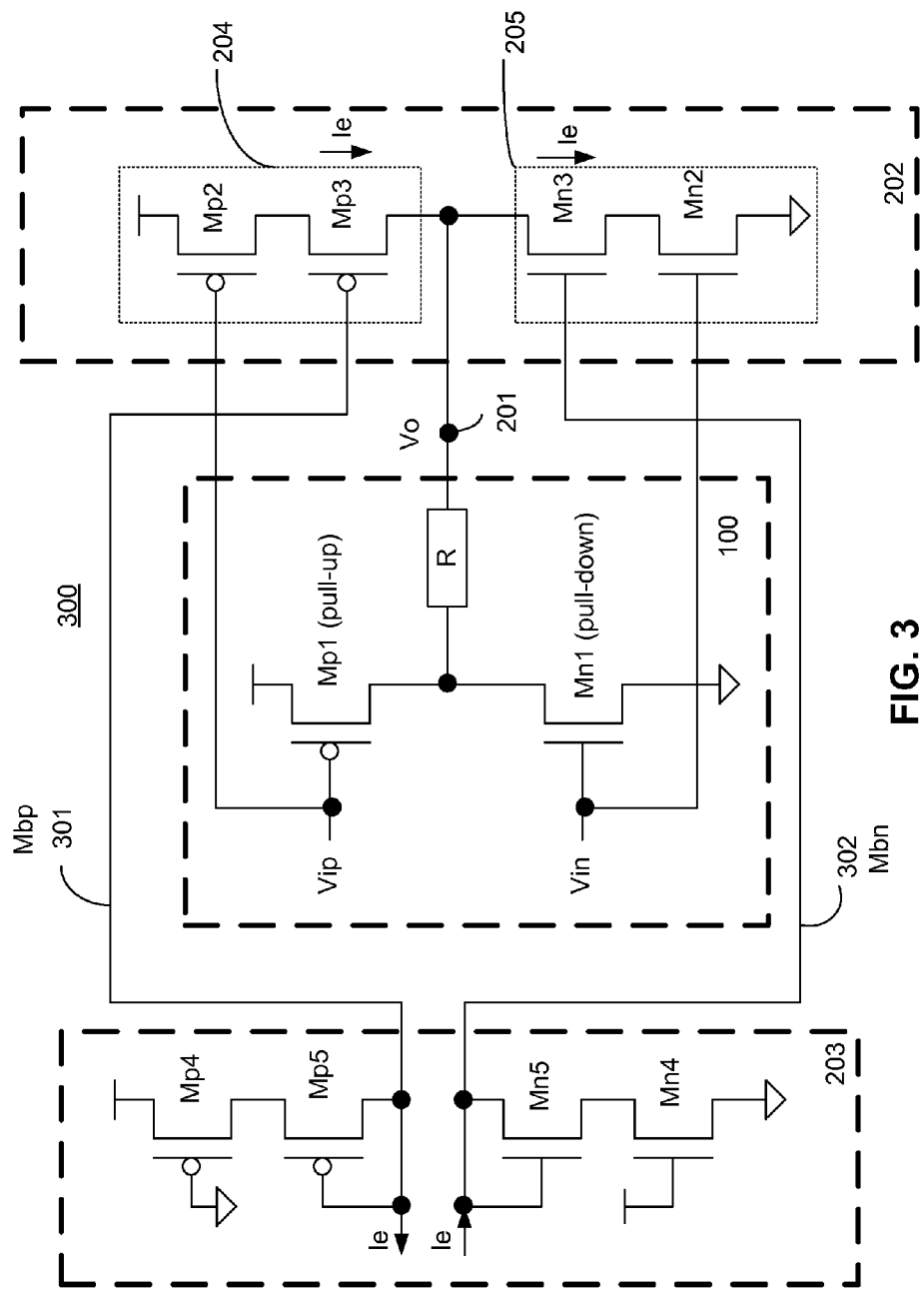
FIG. 3 is a circuit level implementation of the hybrid voltage mode I/O driver with variable wide output signal swing and improved PSSR, according to one embodiment of the invention.

FIG. 3 is a circuit level implementation 300 of the hybrid voltage mode I/O driver 200 of FIG. 2 with variable wide output signal swing and improved PSSR, according to one embodiment of the invention. The embodiment of FIG. 3 is described with reference to FIG. 2.

In one embodiment, the first switching current source 204, coupled to the output node 201, comprises a first P-transistor Mp2, coupled to the power supply node, to receive a signal to be driven on the output node 201; and a second P-transistor Mp3, coupled in series with the first P-transistor Mp2, to receive a bias voltage 301 from the bias circuit 203. The first current source provides a current Ie to the output node 201, to increase the voltage swing of the signal by raising a logical high level of the signal, when the pull-up device Mp1 is turned on. The P-transistor Mp2 of the first current source 204 is a switching transistor which is operable to switch by the signal Vip which also switches the pull-up device Mp1 of the voltage mode Tx driver 100. In one embodiment, when the input signal Vip is at logical low level, the transistors Mp1 and Mp2 are turned on causing the voltage mode Tx driver 100 to drive a logical high level on the output node 201 while the first current source 204 injects current Ie to the output node 201. In this embodiment, the current Ie from the first current source 204 increases the output voltage swing of the signal on the output node 201 driven by the voltage mode Tx driver 200.

In one embodiment, the second current source 205, coupled to the output node 201, comprises: a first N-transistor Mn2, coupled to the ground node, to receive a signal Vin to be driven on the output node 201; and a second N-transistor Mn3, coupled in series with the first N-transistor Mn2, to receive a bias voltage Mbn 302 from the bias circuit 203.

The second current source 205 sinks a current Ie from the output node 201 to the ground node, to increase the voltage swing of the signal by lowering a logical low level of the signal, when the pull-down device Mn1 is turned on. The N-transistor Mn2 of the second current source 205 is a switching transistor which is operable to switch by the signal Vin which also switches the pull-down device Mn1 of the voltage mode Tx driver 100. In one embodiment, when the input signal Vin is at logical high level, the transistors Mn1 and Mn2 are turned on causing the voltage mode Tx driver 100 to drive a logical low level on the output node 201 while the second current source 205 sinks current Ie from the output node 201. In this embodiment, the current Ie sunk by the second current source 205 increases the output voltage swing of the signal on the output node 201 driven by the voltage mode Tx driver 200.

In one embodiment, the bias generator 203 is a replica bias circuit that mimics the design of the first and second current sources 204 and 205. The term "mimics" herein refers to similar circuit topology and transistor sizes. For example, the N-transistors Mn4 and Mn5 of the bias generator 203 are of the same sizes (W/L or a multiple of W/L) and connected similarly (e.g., connections of gate, source, and drain terminals) as the N-transistors Mn2 and Mn3 of the second current source.

In one embodiment, the bias generator 203 is operable to adjust/program the bias voltages Mbp 301 and Mbn 302 by trimming the devices on the bias generator 203. In one embodiment, the trimming of the devices can also occur at the first and second sources 204 and 205 respectively. The term "trimming" herein refers to adding (enabling) or removing (disabling) transistors to change the overall drive strength of the transistors.

In one embodiment, a single bias generator 203 is operable to provide bias voltages Mbp 301 and Mbn 302 to two or more hybrid voltage mode current drivers. In other embodiments, other forms of bias generators may be used without changing the essence of the embodiments of the invention.

Figure 4:
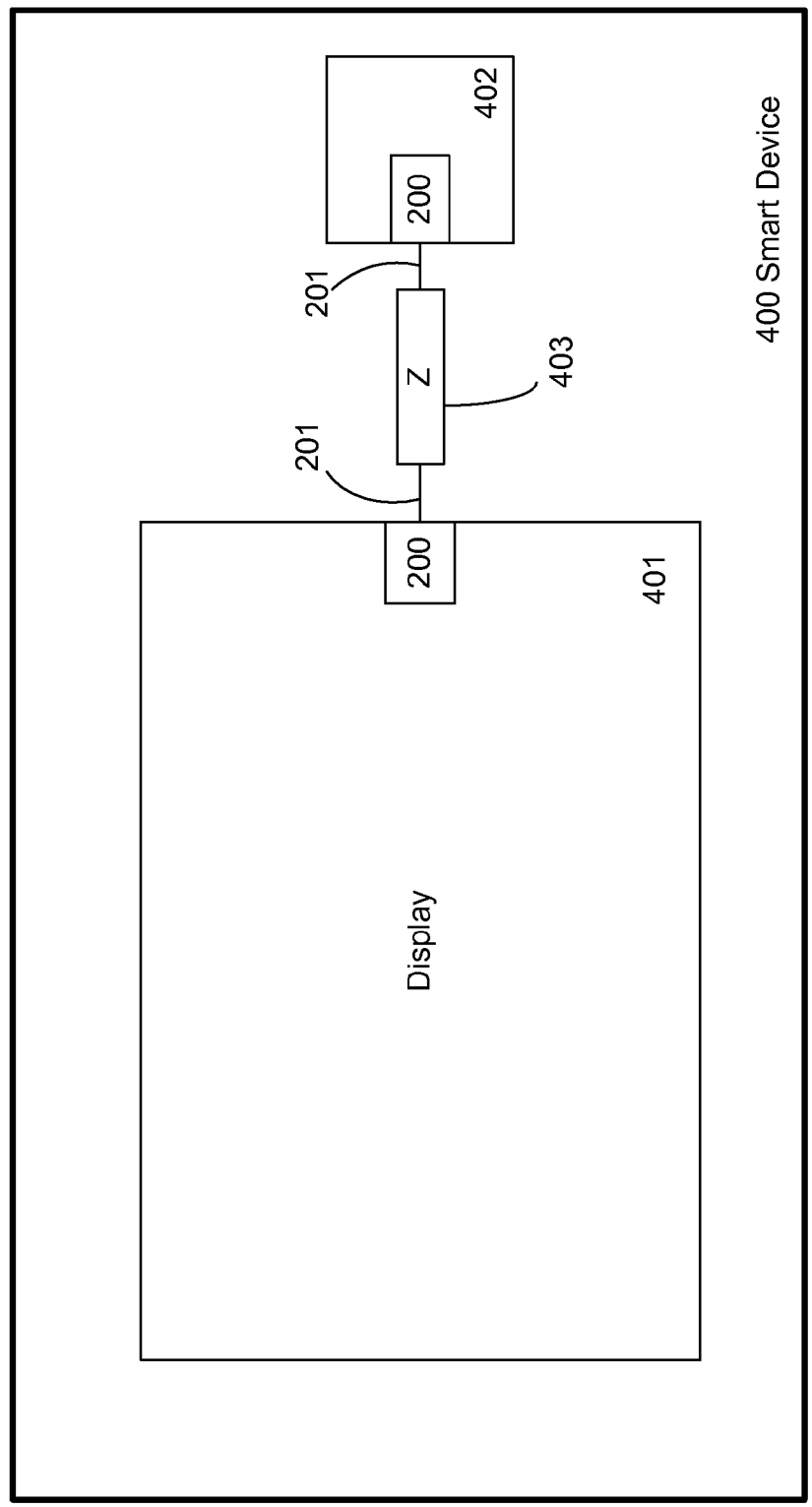
FIG. 4 is smart device comprising an I/O link with the hybrid voltage I/O driver, according to one embodiment of the invention.

FIG. 4 is smart device 400 comprising an I/O link with the hybrid voltage I/O driver 200, according to one embodiment of the invention. In one embodiment, the smart device (e.g., a smart phone, PC tablet, etc.,) comprises a display unit 401 coupled to a processor 402 via the I/O link 403 with impedance Z Ohms. In one embodiment, the processor 402 communicates with the display unit 401 via the hybrid voltage mode Tx drivers 200. In one embodiment, the display unit 401 is a touch pad.

In one embodiment, the voltage swing of the signal on the output node 201 of the hybrid voltage I/O driver 200 is computed as Vswing=Vcc (Z/R)+(Z×Ie), where Vswing is the voltage swing of the signal on node 201, Vcc is the power supply level, Z is the impedance of the I/O link, R is the output impedance of the Tx driver 200, and Ie is the current injected to or sunk from the output node 201. For system designs where the output impedance R of the driver 200 is matched with the impedance Z of the I/O link, the voltage swing of the signal at the output node 201 is given by: Vswing=Vcc+(Z×Ie). This equation shows that the output signal swing of the signal on the output node 201 can be enhanced beyond supply voltage Vcc by introducing the current Ie. For example, for Ie=2 mA and Z=50 Ohms, the output signal swing of the signal on the output node 201 can be enhanced by 100 mV.

In one embodiment, the Tx drivers 200 are coupled to their respective receivers. In one embodiment, the Tx driver 200 and its corresponding receiver (not shown) are compliant with at least one of the standards: Mobile Industry Processor Interface (MIPI®) as described in the MIPI® Alliance Specification for M-PHY(SM) Version 1.00.00 of Feb. 8, 2011 and approved on Apr. 28, 2011; Peripheral Component Interconnect Express (PCIe); Serial Advanced Technology Attachment (SATA); Serial Attached SCSI (SAS); Double Data Rate x (DDRx), were 'x' is an integer (e.g., 4); High-Definition Multimedia Interface (HDMI); or Universal Serial Bus x (USBx), where 'x' is an integer (e.g., 2, 3, . . . ).

In one embodiment, the Tx driver 200 is operable to transmit data at high speed (HS) GEAR ranges from HS-GEAR 1 to HS-GEAR 3 as described in the MIPI® Alliance Specification for M-PHY$^{SM}$ Version 1.00.00 of Feb. 8, 2011 and approved on Apr. 28, 2011.

Figure 5:
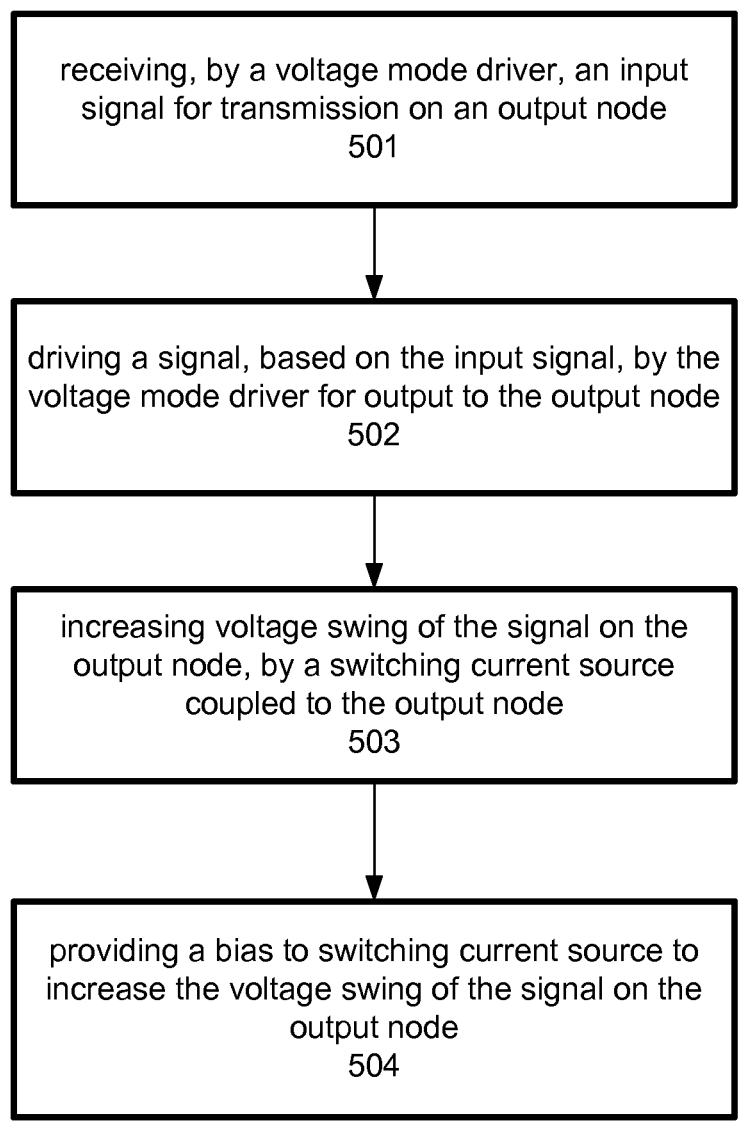
FIG. 5 is a method flowchart for providing a variable wide output signal swing via the hybrid voltage I/O driver, according to one embodiment of the invention.

FIG. 5 is a method flowchart for providing a variable output signal swing via the hybrid voltage I/O driver, according to one embodiment of the invention.

Although the blocks in the flowchart 500 are shown in a particular order, the order of the actions can be modified. Thus, the illustrated embodiments can be performed in a different order, and some actions/blocks may be performed in parallel. Additionally, one or more actions/blocks can be omitted in various embodiments of providing a wider output signal swing with the same power supply level as the voltage mode driver 100. The flow chart of FIG. 5 is illustrated with reference to the embodiments of FIG. 2-4.

At block 501, the voltage mode Tx driver 100 of the hybrid voltage mode Tx driver 200 receives an input signal Vin for transmission on the output node 201. The input signal may be generated by any logic unit of the processor which includes the hybrid voltage mode Tx driver 200. At block 502, the voltage mode driver 100 drives the input signal Vin towards the output node 201.

At block 503, the switching current source 202 increases the voltage swing of the signal (driven by the voltage mode Tx driver 100) on the output node 201. In one embodiment, the voltage swing of the signal on the output node is increased, by the switching current source 202 coupled to the output node 201, by injecting current from a power supply node to the output node 201 when the input signal Vip to the voltage mode driver is a logical low. In one embodiment, injecting the current from the power supply node to the output node comprises: turning on the first current source 204, coupled to the output node 201, of the switching current source 202, wherein the first current source 204 is operable to inject current to the output node 201; and turning off the second current source 205, coupled to the output node 201, of the switching current source 202, wherein the second current source 202 is operable to sink current from the output node 201.

In one embodiment, the voltage swing of the signal on the output node is increased, by the switching current source 202 coupled to the output node 201, by sinking current from the output node 201 to a ground node when the input signal Vin to the voltage mode driver 100 is a logical high level, wherein sinking the current from the output node 201 to the ground node comprises: turning off the first current source 204; and turning on the second current source 205. At block 504, the bias (301 and 302) is provided by the bias generator 203 to the switching current source 202 to increase the voltage swing of the signal on the output node 201.

Figure 6:
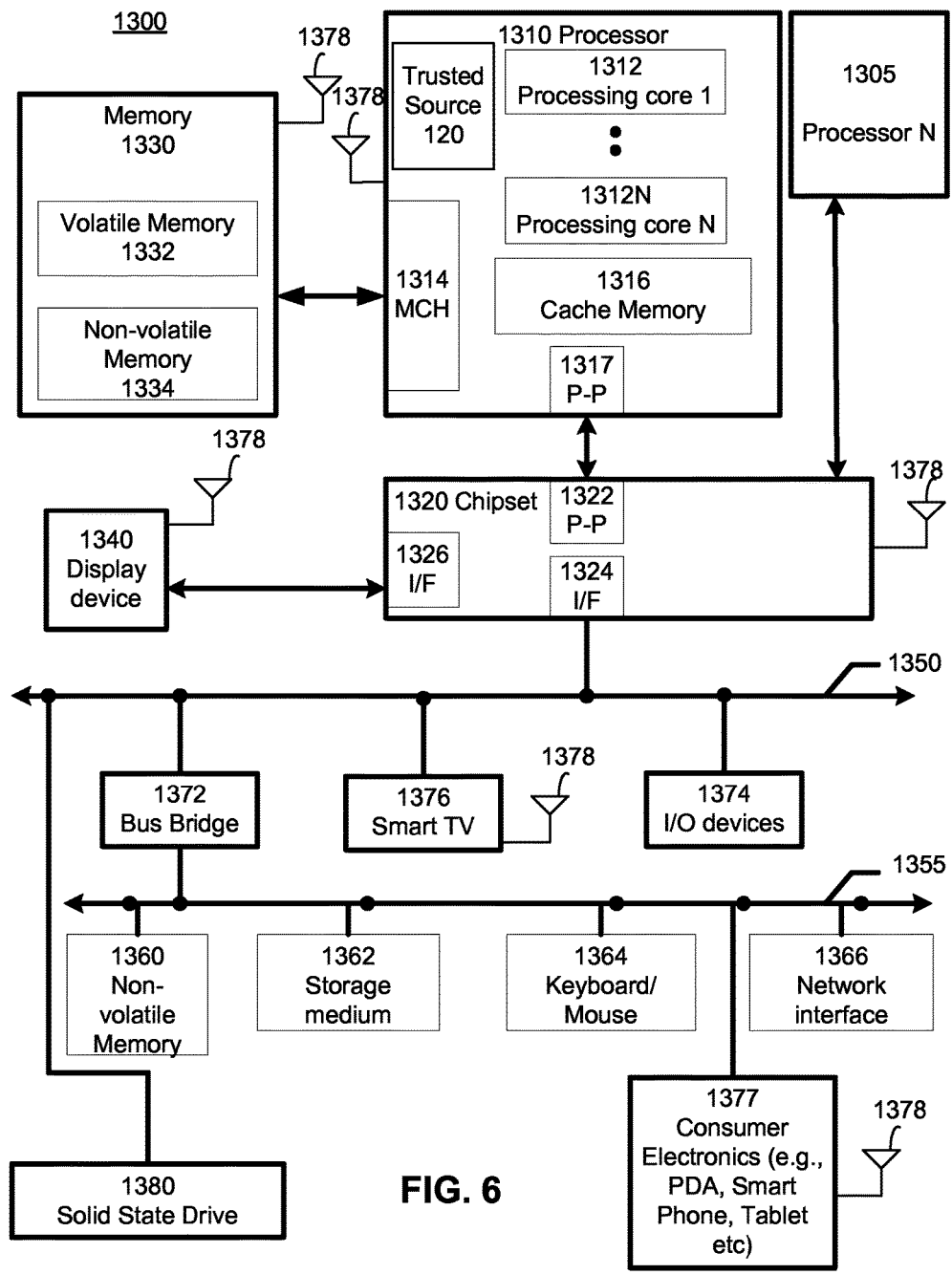
FIG. 6 is a system level computer platform comprising a processor coupled to multiple devices and operable to communicate with the devices via the hybrid voltage mode I/O driver, according to one embodiment of the invention.

FIG. 6 is a system level computer platform comprising a processor coupled to multiple devices and operable to communicate with the devices via the hybrid voltage mode I/O driver, according to one embodiment of the invention. FIG. 6 also includes a machine-readable storage medium to execute computer readable instructions to perform the methods of various embodiments. Elements of embodiments are also provided as a machine-readable medium for storing the computer-executable instructions (e.g., instructions to implement the flowchart of FIG. 5 and other processes discussed herein). The machine-readable medium may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

In one embodiment, the system 1300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, the system 1300 implements the methods disclosed herein and may be a system on a chip (SOC) system.

In one embodiment, the processor 1310 has one or more processing cores 1312 and 1312N, where 1312N represents the Nth processor core inside the processor 1310 where N is a positive integer. In one embodiment, the system 1300 includes multiple processors including processors 1310 and 1305, where processor 1305 has logic similar or identical to logic of processor 1310. In one embodiment, the system 1300 includes multiple processors including processors 1310 and 1305 such that processor 1305 has logic that is completely independent from the logic of processor 1310. In such an embodiment, a multi-package system 1300 is a heterogeneous multi-package system because the processors 1305 and 1310 have different logic units. In one embodiment, the processing core 1312 includes, but is not limited to, pre-fetch logic to fetch instructions, decode logic to decode the instructions, execution logic to execute instructions and the like. In one embodiment, the processor 1310 has a cache memory 1316 to cache instructions and/or data of the system 1300. In another embodiment of the invention, the cache memory 1316 includes level one, level two and level three, cache memory, or any other configuration of the cache memory within the processor 1310.

In one embodiment, processor 1310 includes a memory control hub (MCH) 1314, which is operable to perform functions that enable the processor 1310 to access and communicate with a memory 1330 that includes a volatile memory 1332 and/or a non-volatile memory 1334. In one embodiment, the memory control hub (MCH) 1314 is positioned outside of the processor 1310 as an independent integrated circuit.

In one embodiment, the processor 1310 (e.g., processor 402 of FIG. 4,) is operable to communicate with the memory 1330 and a chipset 1320. In one embodiment, the processor 1310 is also coupled to a wireless antenna 1378 to communicate with any device configured to transmit and/or receive wireless signals. In one embodiment, the wireless antenna interface 1378 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 1332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1334 includes, but is not limited to, flash memory (e.g., NAND, NOR), phase change memory (PCM), read-only memory (ROM), electrically erasable programmable read-only memory (EEPROM), or any other type of non-volatile memory device.

The memory 1330 stores information and instructions to be executed by the processor 1310. In one embodiment, memory 1330 may also store temporary variables or other intermediate information while the processor 1310 is executing instructions. In one embodiment, chipset 1320 connects with processor 1310 via Point-to-Point (PtP or P-P) interfaces 1317 and 1322. In one embodiment, chipset 1320 enables processor 1310 to connect to other modules in the system 1300. In one embodiment of the invention, interfaces 1317 and 1322 operate in accordance with a PtP communication protocol such as the INTEL® QuickPath Interconnect (QPI) or the like.

In one embodiment, the chipset 1320 is operable to communicate with the processor 1310, 1305, display device 1340, and other devices 1372, 1376, 1374, 1360, 1362, 1364, 1366, 1377, etc. In one embodiment, the chipset 1320 is also coupled to a wireless antenna 1378 to communicate with any device configured to transmit and/or receive wireless signals.

In one embodiment, chipset 1320 connects to a display device 1340 via an interface 1326. In one embodiment, the display 1340 includes, but is not limited to, liquid crystal display (LCD), plasma, cathode ray tube (CRT) display, or any other form of visual display device. In one embodiment of the invention, processor 1310 and chipset 1320 are merged into a single SOC. In addition, the chipset 1320 connects to one or more buses 1350 and 1355 that interconnect various modules 1374, 1360, 1362, 1364, and 1366. In one embodiment, buses 1350 and 1355 may be interconnected together via a bus bridge 1372 if there is a mismatch in bus speed or communication protocol. In one embodiment, chipset 1320 couples with, but is not limited to, a non-volatile memory 1360, a mass storage device(s) 1362, a keyboard/mouse 1364, and a network interface 1366 via interface 1324, smart TV 1376, consumer electronics 1377, etc.

In one embodiment, the processor 1310 is communicatively coupled to a solid state drive (SSD) 1280. In one embodiment, the mass storage device 1362 includes, but is not limited to, a solid state drive, a hard disk drive, a universal serial bus flash memory drive, or any other form of computer data storage medium. In one embodiment, network interface 1366 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, HomePlug AV (HPAV), Ultra Wide Band (UWB), Bluetooth, WiMAX, or any form of wireless communication protocol.

While the modules shown in FIG. 6 are depicted as separate blocks within the system 1300, the functions performed by some of these blocks may be integrated within a single semiconductor circuit or may be implemented using two or more separate integrated circuits. For example, although the cache memory 1316 is depicted as a separate block within the processor 1310, the cache memory 1316 can be incorporated into the processor core 1312 respectively. In one embodiment, the system 1300 may include more than one processor/processing core in another embodiment of the invention.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description.

Figure 7:
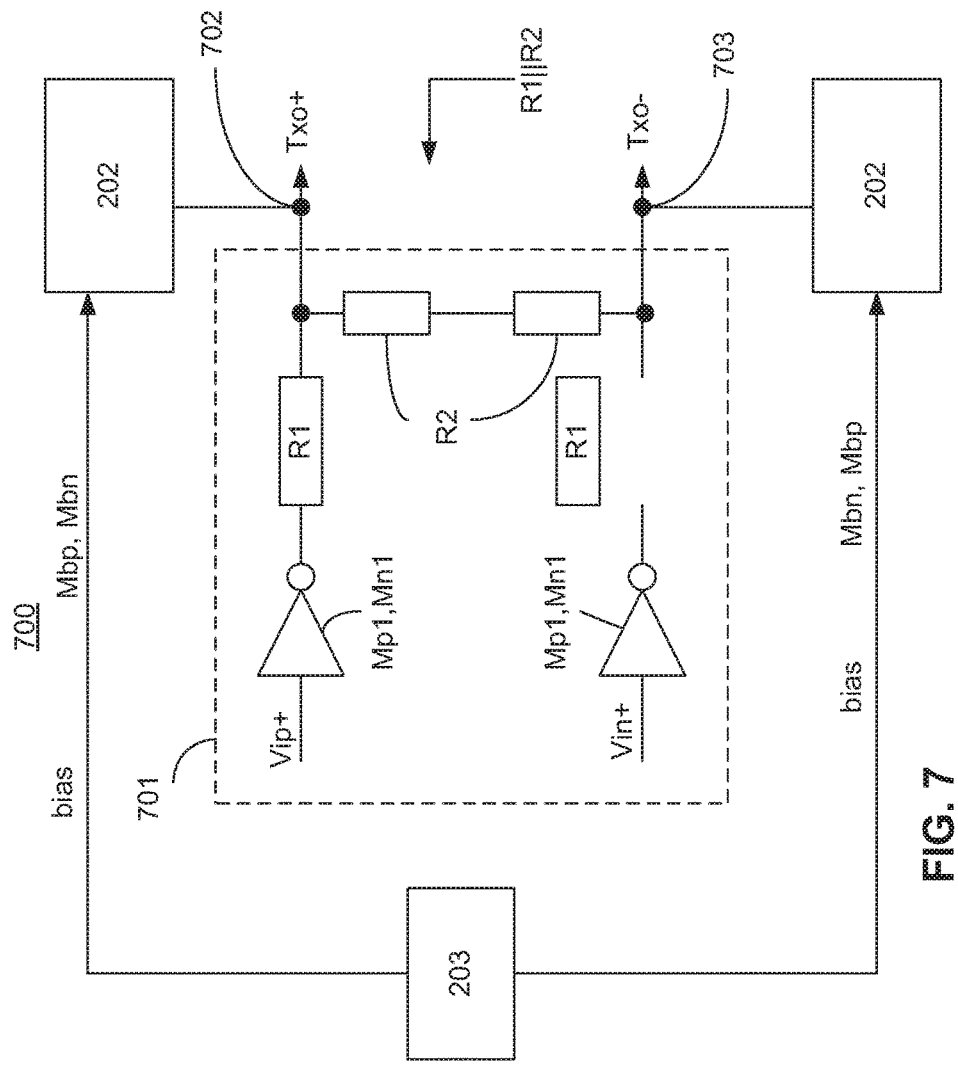
FIG. 7 is a high level circuit of a differential mode hybrid voltage mode I/O driver with variable wide output signal swing and improved PSSR, according to one embodiment of the invention.

For example, the single-ended voltage mode driver of FIGS. 2-3 can be modified to be differential mode driver as shown by FIG. 7. FIG. 7 is a high level circuit of a differential mode hybrid voltage mode Tx driver 700 with variable output signal swing and improved PSSR, according to one embodiment of the invention. The same principals as discussed above with respect to embodiments of FIGS. 2-6 are also applicable to the differential mode hybrid voltage mode Tx driver 700. In one embodiment, the Tx driver 700 comprises a differential mode voltage mode Tx driver 701 with termination impedances R1 and R2 and two drivers (shown with inverter symbols) each of which has transistors similar to the transistors of the Tx driver 100. The output impedance of the Tx driver 700 from the output nodes 702 and 703 is equal to R1 being in parallel to R2, i.e. R1∥R2. In one embodiment, two switching current sources 202 are coupled to the output nodes 702 and 703, wherein the switching current sources 202 receive their bias voltages from the bias generator 203.

The embodiments of the invention are intended to embrace all such alternatives, modifications, and variations as to fall within the broad scope of the appended claims.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus comprising:
   a voltage mode driver;
   an output node coupled to the voltage mode driver to output a signal; and
   a switching current source coupled to the output node, the switching current source being coupled to a power supply node to add a current to the output node, to increase a voltage swing of the signal on the output node, while the signal on the output node is driven by the voltage mode driver, wherein the output node is located between the switching current source and the voltage mode driver.

2. The apparatus of claim 1 further comprises:
   a bias generator to bias the switching current source.

3. The apparatus of claim 2, wherein the bias generator is a replica bias circuit to provide adjustable bias voltages for the switching current source.

4. The apparatus of claim 1, wherein the switching current source comprises:
   a first current source, coupled to the output node, to increase the voltage swing of the signal on the output node by raising a logical high level of the signal.

5. The apparatus of claim 4, wherein the switching current source comprises:
   a second current source, coupled to the output node, to increase the voltage swing of the signal by lowering a logical low level of the signal.

6. The apparatus of claim 5, wherein the voltage mode driver includes pull-up and pull-down devices.

7. The apparatus of claim 5, wherein the second current source is operable to sink the current, to lower the logical low level of the signal, from the output node to a ground node when a pull-down device is on.

8. The apparatus of claim 5, wherein the second current source comprises:
   a first N-transistor, coupled to a ground node, to receive a signal to be driven on the output node.

9. The apparatus of claim 8, wherein the second current source comprises:
   a second N-transistor, coupled in series with the first N-transistor, to receive a bias voltage from a bias generator.

10. The apparatus of claim 4, wherein the first current source is operable to inject the current, to raise the logical high level of the signal, from the power supply node to the output node when a pull-up device is on.

11. The apparatus of claim 4, wherein the first current source comprises: a first P-transistor, coupled to the power supply node, to receive a signal to be driven on the output node.

12. The apparatus of claim 11, wherein the first current source comprises:
a second P-transistor, coupled in series with the first P-transistor, to receive a bias voltage from a bias generator.

13. The apparatus of claim 1, wherein the signal driven by the voltage mode driver is a high-speed (HS) GEAR rate signal compatible with the MIPI® M-PHY(SM) standard.

14. A method comprising:
receiving, by a voltage mode driver, an input signal for transmission on an output node;
driving a signal, based on the input signal, by the voltage mode driver for output to the output node; and
adding a current from a power supply node to the output node to increase a voltage swing of the signal on the output node, by a switching current source coupled to the power supply node and the output node while the signal on the output node is driven by the voltage mode driver, wherein the output node is located between the switching current source and the voltage mode driver.

15. The method of claim 14 further comprises:
providing a bias to the switching current source to increase the voltage
swing of the signal on the output node, wherein increasing the voltage swing of the signal on the output node, by the switching current source coupled to the output node, comprises:
injecting the current from the power supply node to the output node when the input signal to the voltage mode driver is a logical low, or
sinking the current from the output node to a ground node when the input signal to the voltage mode driver is a logical high.

16. A system comprising:
a wireless interface; and
a transmitter, communicatively coupled to the wireless interface, the transmitter comprising:
a voltage mode driver;
an output node coupled to the voltage mode driver to output a signal;
a switching current source coupled to the output node, the switching current source being coupled to a power supply node to add a current to the output node, to increase a voltage swing of the signal on the output node while the signal on the output node is driven by the voltage mode driver, wherein the output node is located between the switching current source and the voltage mode driver; and
a bias generator to bias the switching current source to provide adjustable bias voltages for the switching current source; and
a display unit.

17. The system of claim 16, wherein the switching current source comprises:
a first current source, coupled to the output node, to increase the voltage swing of the signal on the output node by raising a logical high level of the signal; and
a second current source, coupled to the output node, to increase the voltage swing of the signal by lowering a logical low level of the signal.

18. The system of claim 17, wherein the voltage mode driver includes pull-up and pull-down devices, wherein the first current source is operable to inject the current, to raise the logical high level of the signal, from the power supply node to the output node when a pull-up device is on, and
wherein the second current source is operable to sink the current, to lower the logical low level of the signal, from the output node to a ground node when a pull-down device is on.

19. The system of claim 17, wherein the first current source comprises:
a first P-transistor, coupled to the power supply node, to receive a signal to be driven on the output node; and
a second P-transistor, coupled in series with the first P-transistor, to receive a bias voltage from a bias generator.

20. The system of claim 17, wherein the second current source comprises:
a first N-transistor, coupled to a ground node, to receive a signal to be driven on the output node; and
a second N-transistor, coupled in series with the first N-transistor, to receive a bias voltage from a bias generator.

21. The system of claim 16, wherein the signal driven by the voltage mode driver is a high-speed (HS) GEAR rate signal compatible with the MIPI® M-PHY(SM) standard.

22. The system of claim 16 further comprises:
a receiver coupled to the transmitter via a transmission medium, wherein the receiver is a MIPI® M-PHY(SM) receiver which is operable to receive highspeed (HS) GEAR rate signals.

23. The system of claim 16, wherein the transmitter and a corresponding receiver are compliant with at least one of the standards:
Industry Processor Interface (MIPI®);
Peripheral Component Interconnect Express (PCIe);
Serial Advanced Technology Attachment (SATA);
Serial Attached SCSI (SAS);
Double Data Rate x (DDRx), were 'x' is an integer;
High-Definition Multimedia Interface (HDMI); or
Universal Serial Bus x (USBx), where 'x' is an integer.

24. The system of claim 16, wherein the display unit is a touch pad of a touch screen.

25. The system of claim 16, wherein the transmitter is a MIPI® M-PHY(SM) transmitter which is operable to receive high-speed (HS) GEAR rate signals.

* * * * *